United States Patent [19]

Korwin-Pawlowski

[11] Patent Number: 4,942,139
[45] Date of Patent: Jul. 17, 1990

[54] METHOD OF FABRICATING A BRAZED GLASS PRE-PASSIVATED CHIP RECTIFIER

[75] Inventor: Michael Korwin-Pawlowski, Ft. Salonga, N.Y.

[73] Assignee: General Instrument Corporation, New York, N.Y.

[21] Appl. No.: 151,066

[22] Filed: Feb. 1, 1988

[51] Int. Cl.[5] .............................................. H01L 3/00
[52] U.S. Cl. ..................................... 437/209; 437/135; 437/180; 427/229; 174/94 R; 357/67
[58] Field of Search ............... 437/180, 209, 213, 135; 427/229; 357/67; 174/94 R

[56] References Cited

U.S. PATENT DOCUMENTS

| | | | |
|---|---|---|---|
| 3,198,999 | 8/1965 | Baker et al. | 437/180 |
| 3,743,538 | 7/1973 | Mungaard | 437/180 |
| 3,801,880 | 4/1974 | Harada et al. | 437/180 |
| 3,811,186 | 5/1974 | Larnerd et al. | 437/180 |
| 3,871,014 | 3/1975 | King et al. | 437/180 |
| 3,871,016 | 3/1975 | Lin et al. | 437/180 |
| 3,940,847 | 3/1976 | Park et al. | 437/180 |

Primary Examiner—Brian E. Hearn
Assistant Examiner—Beverly A. Pawlikowski
Attorney, Agent, or Firm—Bryan & Levitin

[57] ABSTRACT

A semiconductor device is fabricated by applying a glass layer of material over a junction area of a semiconductor die. Aluminum metalization layers are applied to the top and bottom of the die at locations spaced from the glass and are used for a high temperature brazing of contact members to the die. Etching of the die, plus unavoidable etching of the contact members, is conducted without contamination of the junction area.

1 Claim, 2 Drawing Sheets

METHOD OF FABRICATING A BRAZED GLASS PRE-PASSIVATED CHIP RECTIFIER

FIELD AND BACKGROUND OF THE INVENTION

The present invention relates in general to semiconductor devices, and, in particular, to a new and useful method of fabricating a semiconductor device using high temperature brazing to connect contact members to the semiconductor material, while avoiding contamination of the semiconductor junction in the semiconductor material by metal ions.

Semiconductor devices have been manufactured by brazing semiconductor dies between two contact members. These contact members may be disks, slugs or leads. Subsequent to connecting the contact members, a chemical etching process is performed to improve the electrical characteristics of the device. This is followed by glass encapsulation using various methods such as coating with glass slurry, firing or melting a glass sleeve around the semiconductor junction, to protect the junction from the environment and to stabilize the electrical characteristics of the device.

To facilitate connecting the device to other components in an electrical circuit, connecting members are usually attached to the contact members. The connecting members may be in the form of wires, metal disks or slugs.

The use of high temperature brazing joints between the semiconductor die and the contact members helps provide a strong and stable structure.

A major problem associated with such a construction process is that during the chemical etching step, the metal contact and connecting members are etched along with the semiconductor material. Metal ions are deposited on the semiconductor rectifying junction in minute quantities. This causes contamination of the semiconductor junction which results in deterioration of its electrical properties. In particular, the peak reverse voltage and reverse leakage currents are adversely effected. Another effect is increasing instability of the electrical characteristics of the semiconductor device, both short term and long term.

To reduce such contamination during the etching process, techniques have been developed to etch and pre-passivate the semiconductor junctions during the wafer stage. This is before the application of contact metalization and before dividing the wafer into single individual semiconductor dies. Pre-passivation is often done by applying several layers of glass directly on the junction of the semiconductor. The glass layers may also be applied with intermediate layers consisting, for example, of oxides, nitrides, polysilicon, or other combinations.

After division or singulation of the wafer, pre-passivated semiconductor units are obtained. These are sometimes referred to as glass passivated pellets or GPP's.

Among the known methods of applying glass in the process of manufacturing the glass passivated pellets are spin coating, followed by photolithography, doctor blading, electrophoresis and screen printing. GPP's are then soldered to contact members, using soft low temperature solders with melting temperatures below 350° C. and containing mostly such metals as lead, tin and indium, with other small additives.

Semiconductor devices using soldered GPP's do not always have sufficient mechanical strength, however.

Another limitation of soft-soldered devices is thermal fatigue of the solder, and, generally, much worse reliability at elevated temperatures than the brazed devices. Those limitations were long recognized, but attempts to braze the GPP dies were unsuccessful due to severe degradation of electrical characteristics occurring during brazing, in particular, significant increase of forward voltage drop and catastrophic decrease of peak reverse voltage.

SUMMARY OF THE INVENTION

The present invention comprises a method of fabricating a semiconductor device, as well as the semiconductor device itself, wherein glass is applied to an area of a semiconductor die and one or more contact members are attached to an exposed surface of the die at a location at least slightly spaced from the glass. Contact members are then brazed to the die with an intermediate metalization layer having a melting point above 575° C.

The intermediate metalized layer is advantageously substantially made of aluminum with the contact members being made from tungsten, molybdenum, tantalum or alloys thereof. The semiconductor die is advantageously silicon.

The aluminum may be deposited by evaporation or sputtering in a vacuum and thereafter patterned, using photolithographic methods in such a way as to form a central contact area, which is separated from the glass coating that is advantageously applied to the peripheral area of the semiconductor die. This leaves an area of semiconductor material which is free of both glass and aluminum.

The contact members are also held at a spaced position away from the glass.

The glass advantageously covers a p-n junction of the semiconductor die.

The glass may also be deposited on the semiconductor, along with intermediate layers of oxides, nitrides and polycrystalline semiconductor, between the glass layers and the semiconductor. One advantageous sequence of layers is, starting from the silicon surface, semi-insulating polycrystalline silicon followed by a layer of silicon oxide.

The glass may also be coated with additional layers, such as silicon dioxide, polyimides or both.

The semiconductor device is then preferably encapsulated, for example, by epoxy, silicone plastics or glass of the same or other composition than the glass used for coating the junction. Encapsulation can be done by liquid coating, transfer molding or conformal powder coating.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
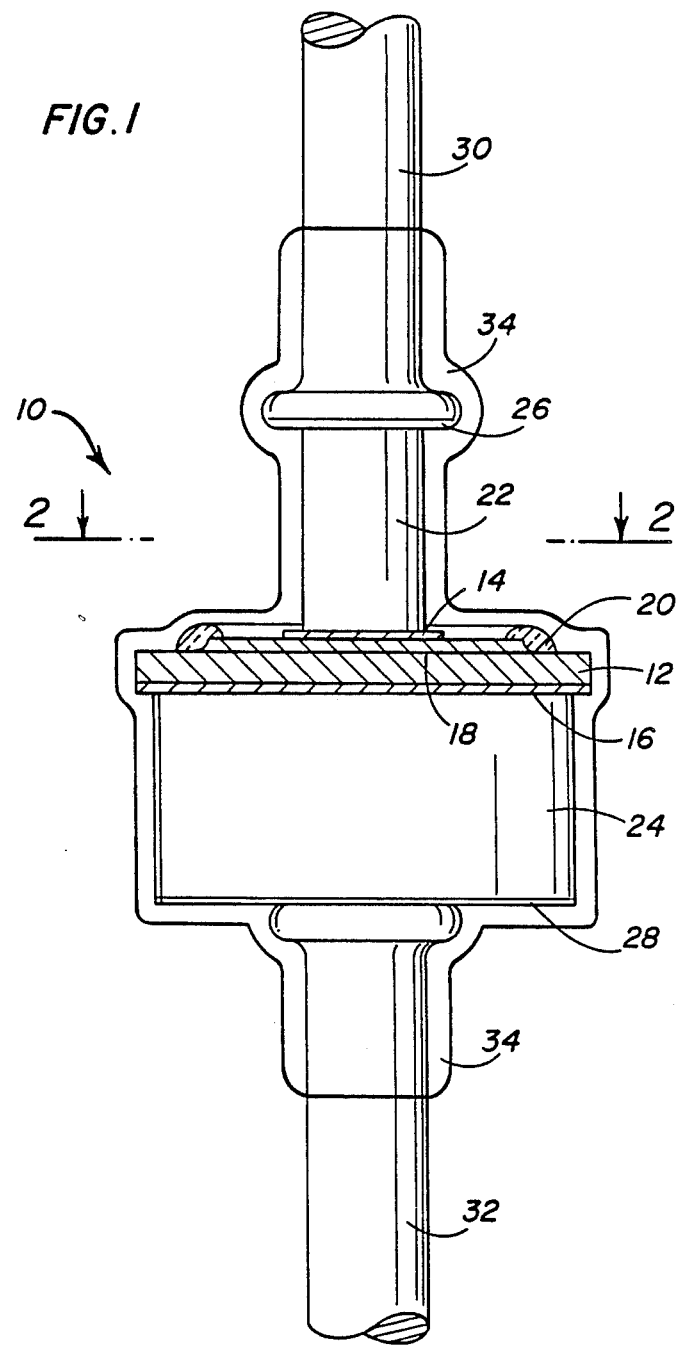
FIG. 1 is a side elevational view of a semiconductor device in accordance with the present invention partly in section.

Referring to the drawings in particular, the invention embodied in FIG. 1 comprises a semiconductor device generally designated 10 having an active component in the form of a semiconductor die 12, with upper and lower metalization layers 14 and 16 on respective upper and lower surfaces of the die. Die 12 has a p-n junction 18 and is advantageously made of silicon, having appropriate doping. This can be made by diffusion into a semiconductor wafer, followed by patterning to delineate die areas. The diffused junction depth is at least 55 micrometers.

In accordance with the present invention, the semiconductor die 12 is pre-passivated by an annular layer of glass 20 which is applied to an area of the surface of die 12, around the periphery of junction 18. This can be done, for example, by spin coating, followed by photolithography, doctor blading, electrophoresis, screen printing or the like.

Either before or after application of the glass layer 20, metalization layers 14 and 16 are applied. They are preferably substantially pure aluminum which can be deposited, for example, by evaporation or sputtering. The aluminum can then be photolithographically delineated on one or both sides of the die, as necessary, and etched. In this way, for the top surface of the die, only a central area 14 of aluminum remains, which is surrounded by the glass passivation. The thickness of the deposited aluminum layers 14 and 16 is advantageously ten micrometers.

The aluminum contact area must be separated from the glass by a distance of at least two thousandths of an inch. This can be achieved by using an aluminum photolithography mask with the contact area which is smaller than the contact area of the glass photolithography mass.

Upper and lower contact members 22 and 24 respectively are first brazed by brazing alloy 26 and 28 to respective connecting members 30 and 32. The contact members 22 and 24 are advantageously made of tungsten, molybdenum, tantalum or alloys thereof. A device of the present invention, which has been successfully fabricated, utilizes molybdenum contact members that are brazed to copper leads acting as the connecting members 30 and 32, by brazing alloy of 80-89 weight percent copper, 5-15 weight percent silicon and 4-6 weight percent phosphorous, brazed at about 700° C.

After pre-brazing the leads to the contact members, the contact members are brazed to opposite sides of the die 12 having the metalization layers 14 and 16. This is done at a temperature of at least 575° C. It is noted that aluminum melts at about 660° C., but forms eutectic with silicon at about 577° C.

The device 10 is thereafter encapsulated by an insulating layer 34 which may, for example, be epoxy, silicone plastic or glass. Glass encapsulation is particularly useful as a practical matter. The encapsulation can be achieved by liquid coating, transfer molding, conformal powder coating and the like.

While starting with semiconductor dies 12 which were pre-sorted to 950 volts, the resulting devices showed peak reverse voltage of over 690 volts and typically over 1,000 volts. This was with little degradation of PIV readings (typically 5-15 percent degradation, exceeding 100 volts).

Figure 2:
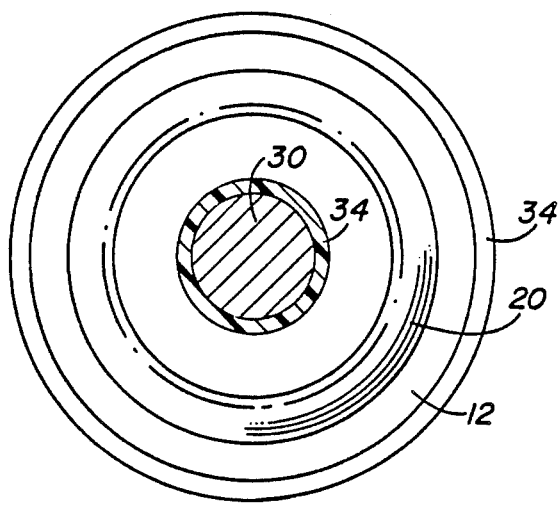
FIG. 2 is a sectional view taken on line 2—2 of FIG. 1.

FIG. 2, which is a sectional view of FIG. 1, showing the top surface of the semiconductor die 12, shows the annular shape of glass passivation 20.

Figure 3:
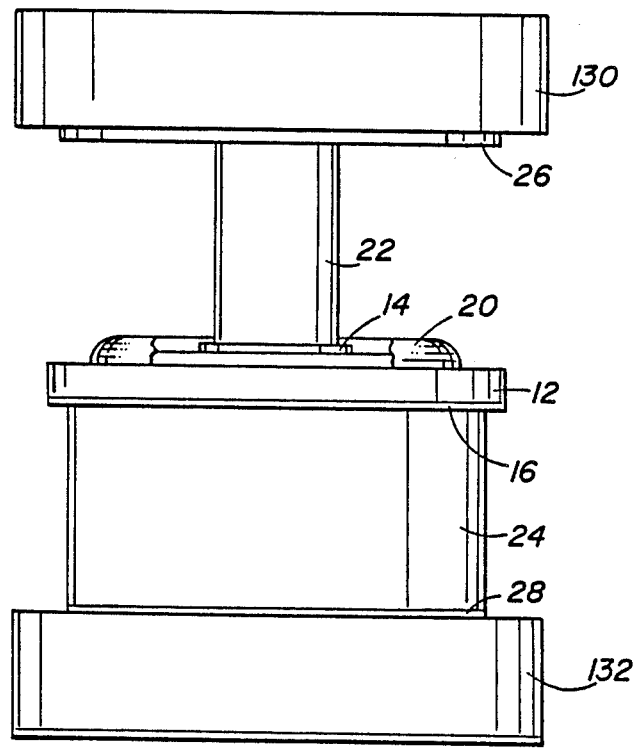
FIG. 3 is a view similar to FIG. 1 showing another embodiment of the invention.

FIG. 3 shows another embodiment of the invention, but without encapsulation, wherein the same reference numerals are used to designate the same or similar parts. FIG. 3 differs from FIG. 1 in that connecting disks 130 and 132 have been pre-brazed to respective contact members 22 and 24. The active semiconductor components made up of the semiconductor die 12, its glass pre-passivation 20 and the metalization layers 14 and 16 are the same as those used in the embodiment of FIG. 1.

While a specific embodiment of the invention has been showed and described in detail to describe the application of the principles of the invention, it will be understood that the invention may embodied otherwise without departing from such principles.

The invention claimed is:

1. A method of fabricating a semiconductor device, comprising making a p-n junction by diffusion into a semiconductor wafer, patterning the wafer to delineate at least one die with an exposed p-n junction area, applying glass to the exposed p-n junction area of the semiconductor die, and applying a contact member to a surface of the semiconductor die by brazing the contact to the die with an intermediate metalization layer having a melting point above 575° C.

2. A method according to claim 1 wherein the intermediate metalization layer is made substantially of aluminum and the contact member is made of a material selected from the group consisting of tungsten, molybdenum, tantalum and alloys thereof.

3. A method according to claim 2 including patterning the wafer to delineate a plurality of die areas of semiconductor dies, applying the glass to peripheral areas of each semiconductor die, depositing the intermediate metalization layer in a vacuum, patterning the deposited intermediate metalization layer to form a control contact area on the surface of the semiconductor die which is spaced from the area of the die to which the glass is applied and singulating the wafer into individual dies.

4. A method according to claim 3, wherein the diffused junction has a depth of at least 55 micrometers.

5. A method according to claim 3 including applying the glass to a peripheral area of the semiconductor die, the semiconductor die having an area between the glass and the metalization layer which is free of both glass and metalization layer material.

6. A method according to claim 5 wherein the metalization layer is spaced from the glass area by at least two thousandths of an inch.

7. A method according to claim 1, including attaching a second contact member to an opposite side surface of the semiconductor die from the surface to which the first-mentioned contact member is attached by brazing the second contact member to the die with an intermediate metalization layer having a melting point above 575° C., the glass being spaced from first-mentioned and the second contact member.

8. A method according to claim 7, in which both the first-mentioned and second contact members are attached in a single brazing process.

9. A method according to claim 8, in which the brazing is done in a protective atmosphere of gases from the inert or chemically reducing group, including at least one of the following: Nitrogen, Argon, Helium or Hydrogen.

10. A method according to claim 1, in which the brazing is done in vacuum.

11. A method according to claim 1, in which the brazing is done at a temperature in the range from 680° C. to 720° C.

12. A method according to claim 1 including applying an intermediate passivating layer between the glass and the semiconductor die which is made of a material selected from the group consisting of oxides, nitrides and polycrystalline semiconductor materials.

13. A method according to claim 1, including, before applying the glass, applying a semi-insulating polycrystalline silicon on the area of the die, thereafter applying a layer of silicon oxides onto the semi-insulating polycrystalline silicon, and thereafter applying the glass on the silicon oxide layer.

14. A method according to claim 1 including applying a layer of material over the glass.

15. A method according to claim 14 wherein the layer of material applied over the glass is at least one of silicon oxides and polyimides.

16. A method according to claim 15 including encapsulating the semiconductor die with applied glass and connected contact member within an outer coating of insulating material.

17. A method according to claim 16 wherein the insulating material is selected from the group consisting of epoxy, silicone plastics, and glass.

18. A method according to claim 17 wherein the insulating material is applied by one of liquid coating, transfer molding and conformal powder coating.

19. A method according to claim 1 including brazing a connecting member to the contact member at a location spaced away from the die.

* * * * *